US006313647B1

(12) United States Patent
Feng et al.

(10) Patent No.: US 6,313,647 B1
(45) Date of Patent: Nov. 6, 2001

(54) TECHNIQUE FOR MEASURING RESISTIVITY

(75) Inventors: Zhu Feng, Fremont; Chiu-Shing Frank Poon, Oakland; Tan Guo Liu, San Francisco; Vidya Gubbi, Milpitas; Chung Yuang Shih, Cupertino, all of CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/436,586

(22) Filed: Nov. 9, 1999

Related U.S. Application Data
(60) Provisional application No. 60/107,697, filed on Nov. 9, 1998.

(51) Int. Cl.[7] .................................................. G01R 29/26
(52) U.S. Cl. ........................ 324/713; 324/602; 324/609
(58) Field of Search ............................ 324/158.1, 754, 324/249, 244, 207.12, 602, 609, 693, 713, 715, 719; 73/105; 360/150; 96/1.5

(56) References Cited

U.S. PATENT DOCUMENTS

| | | | |
|---|---|---|---|
| H585 | * | 2/1989 | Cavallo ................................ 324/249 |
| 4,025,339 | * | 5/1977 | Kuehnle ................................ 96/1.5 |
| 5,078,846 | | 1/1992 | Miller et al. . |
| 5,488,857 | * | 2/1996 | Homma et al. ...................... 73/105 |
| 5,562,965 | | 10/1996 | Gui et al. . |
| 5,785,825 | | 7/1998 | Hwang et al. . |
| 5,820,945 | | 10/1998 | Wei et al. . |
| 5,824,387 | | 10/1998 | Boutaghou et al. . |
| 5,874,169 | | 2/1999 | Falcone . |
| 5,956,217 | * | 9/1999 | Xuan et al. ......................... 360/135 |
| 6,105,432 | * | 8/2000 | Taniguchi et al. .................. 324/212 |
| 6,114,850 | * | 9/2000 | Hayashi ............................... 324/252 |

* cited by examiner

Primary Examiner—Glenn W. Brown
Assistant Examiner—Jimmy Nguyen
(74) Attorney, Agent, or Firm—Merchant & Gould P.C.

(57) ABSTRACT

Disclosed is a new technique for measuring the resistivity of ultra-thin carbon films (less than 200 Å). The technique involves using a probe with very smooth surface, a thin layer lubricant (20–30Å) that enables the intimate and stable electrical contact between probe and the thin film, and measurement of I-V curve to determine resistance. Resistivity measurements were conducted on carbon films doped with hydrogen and nitrogen at different mixture ratios and different thicknesses, and the results were compared with those obtained on a commercially available machine that uses a mercury probe. The advantages of the present technique include simple in use, less expensive and quick measurements with reasonably good accuracy.

21 Claims, 10 Drawing Sheets

TECHNIQUE FOR MEASURING RESISTIVITY

RELATED APPLICATIONS

This application claims priority to provisional application Serial No. 60/107,697, filed Nov. 9, 1998, entitled "NOVEL TECHNIQUE FOR MEASURING RESISTIVITY OF THIN CARBON FILMS ON MAGNETIC DISK AND HEAD".

TECHNICAL FIELD

The invention relates generally to disc drives and specifically to disc drives having protective thin dielectric layers such as thin carbon overcoats. More particularly, the invention relates to a technique for measuring the resistivity of a thin carbon overcoat on a disc drive surface.

BACKGROUND

Disc drives are used in workstations, laptops and personal computers to store large amounts of information in a readily accessible form. Typically, a disc drive includes a magnetic disc that is rotated at a constant high speed by a spindle motor. The disc surfaces are divided into a series of concentric data tracks that can store information as magnetic transitions on the disc surface.

A disc drive also includes a set of magnetic transducers that are used to either sense existing magnetic transitions during a read operation or to create new magnetic transitions during a write operation. Each magnetic transducer is mounted in a head, which in turn is mounted to a rotary actuator arm via a flexible element which can accommodate movement of the head during operation. The actuator arm serves to selectively position the head over a particular data track to either read data from the disc or to write data to the disc.

The actuator arm is driven by a voice coil motor. The magnetic transducers, mounted in the heads, are present at the ends of the arms which extend radially outward from a substantially cylindrical actuator body. This actuator body is moveably supported by a ball bearing assembly known as a pivot bearing or pivot bearing assembly. The actuator body is parallel with the axis of rotation of the discs. The magnetic transducers, therefore, move in a plane parallel to the discs surface.

The voice coil motor typically includes a coil which is mounted in the actuator arm at the end opposite the heads. This coil is permanently immersed in a magnetic field resulting from an array of permanent magnets which are mounted to the disc drive housing. Application of current to the coil creates an electromagnetic field which interacts with the permanent magnetic field, causing the coil to move relative to the permanent magnets. As the coil moves, the actuator arm also moves, causing the heads to move radially across the disc surface.

The heads literally fly on a wedge of air as the disc surface rotates in close proximity to the heads. A protective layer, for example a thin carbon overcoat, is widely used both on magnetic heads and on discs to protect against wear and damage. These thin carbon overcoats are about 50 to 200 Angstroms (Å) in depth. The properties of these carbon overcoats have become increasingly important as the flight height, i.e., the distance between the heads and the spinning disc, continues to become smaller and the thickness of the carbon film becomes thinner. These changes are required to meet demands for ever-higher recording capacities. One of the important properties of thin carbon films is the film's resistivity as this property is directly related to the corrosion and degradation of the head/disc interface and therefore affects the tribological performance and reliability of the drive.

Resistivity can be used to monitor the carbon sputtering process used to create the thin carbon overcoat because the resistivity of the thin carbon film is highly sensitive to carbon composition and to any impurities that may be incorporated in the film.

However, measuring the resistivity of thin dielectric films can be difficult. One method previously used combines an electrometer with a two-point probe. The resistivity is obtained from the electrometer at a fixed voltage. Unfortunately, mechanical penetration of the carbon film is a problem as it is difficult to accurately control the load put on the disc through the probe. Another problem involves electrical penetration since very thin films tend to breakdown at voltages of as low as 5 volts. Therefore, the resistance values measured with this technique are usually characterized as having very large variations, perhaps in the range of 10 to 1000 times the mean value.

Another method previously used measure resistivity is a commercial technique known as the Four Point Probe. In this technique, four probes penetrate into the film to ensure good electrical contact. However, for very thin films on a metallic substrate, it is very difficult to control the penetration depth of the probe tips within the film. Frequently, the probes actually penetrate through the carbon layer to make direct contact with the metallic substrate. Because of this, large variations of measured resistance values also result.

Yet another method uses a mercury probe instead of a mechanical probe. This probe effectively prevents the mechanical penetration of the film described above. However, certain films suffer from mercury drop, which refers to a condition in which residual mercury remains on the surface of the film after the measurements. Consequently, this technique is limited to films having little or no affinity to mercury drop.

Consequently, a need remains for a simple and inexpensive technique for measuring the resistivity of thin dielectric films such as carbon overcoats. A need remains for a technique that is highly sensitive to impurity type and level, as well as being sensitive to small changes in film depth.

SUMMARY OF THE INVENTION

The invention involves a simple and inexpensive technique for measuring the resistivity of thin dielectric films such as thin carbon overcoats. This technique has high sensitivity to carbon properties such as the identity and level of impurities, as well as to thickness variations of a few tens of Angstroms.

Accordingly, a preferred embodiment of the invention is found in a method for determining the resistivity of a thin carbon overcoat having a known depth. The method includes the steps of providing a substrate including the thin carbon overcoat and providing an apparatus having a substrate holding device and an electronic probe. The electronic probe includes a magnetic head having two electrically distinct surfaces having a known total contact area. The method also includes the steps of placing a thin layer of lubricant upon the thin carbon overcoat, bringing the electronic probe into close proximity to the substrate to be tested, and obtaining an I-V curve. The depth of the thin carbon overcoat and the contact area of the electronic probe are used to calculate the resistance and resistivity of the thin carbon overcoat.

A preferred embodiment of the invention is also found in an apparatus for measuring the resistivity of a thin carbon overcoat. The apparatus includes an electrically insulating holding structure suitable to hold a substrate having the thin carbon overcoat, an electronic probe including a magnetic head having two electrically distinct surfaces having a known total surface area, and an electrometer that can convert I-V curve data into resistance and resistivity values.

These and other features as well as advantages that characterize the present invention will be apparent from a reading of the following detailed description and a review of the associated drawings.

DETAILED DESCRIPTION OF THE PREFERRED EMBODIMENTS

Figure 1:
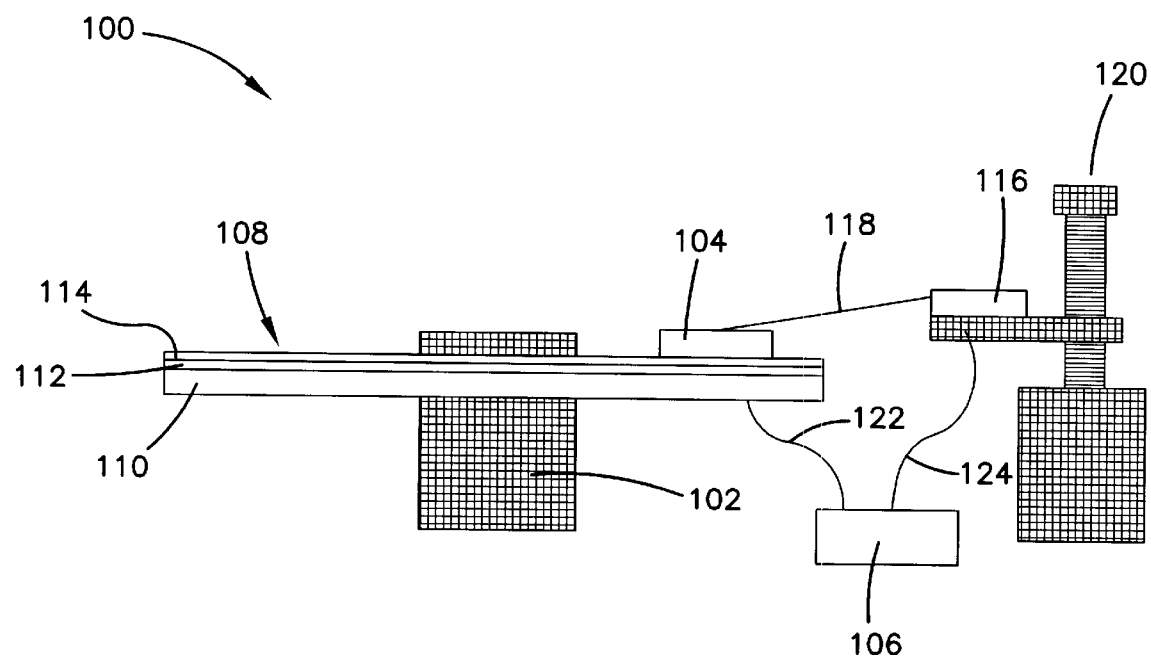
FIG. 1 is a schematic diagram showing the apparatus for measuring resistivity according to a preferred embodiment of the present invention.

FIG. 1 shows a preferred embodiment of the apparatus 100 used to measure the resistance of a thin carbon overcoat on a disc. Apparatus 100 includes an insulating disc holder 102, an electronic probe 104, a magnetic 108 and an electrometer 106. As illustrated, magnetic disc 108 includes a substrate 110, a magnetic layer 112 and a thin carbon overcoat 114. Assembly 120 includes mounting block 116 which anchors and controls suspension 118, which is seen schematically in FIG. 1. Suspension 118 locates electronic probe 104 in a desired position on thin carbon overcoat 114 and provides a desired force normal to the thin carbon overcoat 114 as described hereinafter. Suspension 118 also includes electrical communication with electronic probe 104 and electrometer 106. The specific geometry of suspension 118 is unimportant as long as it is able to hold electronic probe 104 flat against the surface being tested, and is able to provide the desired normal force.

In operation, electrometer 106 produces an applied voltage vertically through disc 108. The voltage is measured between electronic probe 104, which is in contact with the upper surface of thin carbon overcoat 112, and the bottom surface of substrate 110 and then measures the resulting current. Electrometer 106 is in electrical communication with substrate 110 and electrometer 106 via electrical conduits 122 and 124, respectively. Once the current is determined, the resistance is easily calculated using the equation:

$$V = I \times R,$$

where V represents voltage, I represents current and R represents resistance. Resistivity can then be calculated using the equation:

$$\rho = R \frac{A}{t},$$

where $\rho$ represents resistivity, A represents real contact area present between the surface being tested and electronic probe 104, and t represents carbon thickness.

The I-V data obtained by the electrometer can be processed in a number of ways. The simplest involves reading a display on the electrometer and then manually calculating the corresponding resistance and resistivity. Alternately, the electrometer can be in communication with a personal computer or a programmable microcontroller that can be used to automatically obtain current and voltage data and calculate the corresponding resistance and resistivity.

The components and measurement technique of the present invention are chosen or designed to overcome the problems and difficulties associated with previous measurement techniques.

In addition to carbon layers such as thin carbon overcoats on platters and other disc drive components, testing apparatus 100 is suitable for determining the resistance and resistivity of other dielectric films as well. Examples include semiconductor films and even insulating films.

Preferably, testing apparatus 100 is used to determine the resistance and resistivity of thin carbon overcoats such as those used to protect magnetic storage media such as hard disc drive platters and the magnetic heads used to read and write information to the magnetic storage media. These thin carbon overcoats are not limited strictly to carbon, however, as hydrogen and nitrogen can be included in the carbon layer. Preferably, hydrogen is present in the carbon layer at a concentration of about 5 to 40 mole percent and nitrogen is present at a concentration of less than about 25 mole percent.

An important feature of a preferred embodiment of the present invention involves obtaining good head/disc contact without mechanical penetration into the thin carbon overcoat. This is accomplished, in part, by preferably using a magnetic head as the electrical probe. The magnetic head is made of a conductive material, preferably $Al_2O_3$—TiC, and has a very smooth surface. This provides for good contact with a disc surface without mechanical penetration of the disc surface, as the head has a relatively large contact area as compared to a mechanical probe.

Figure 2:
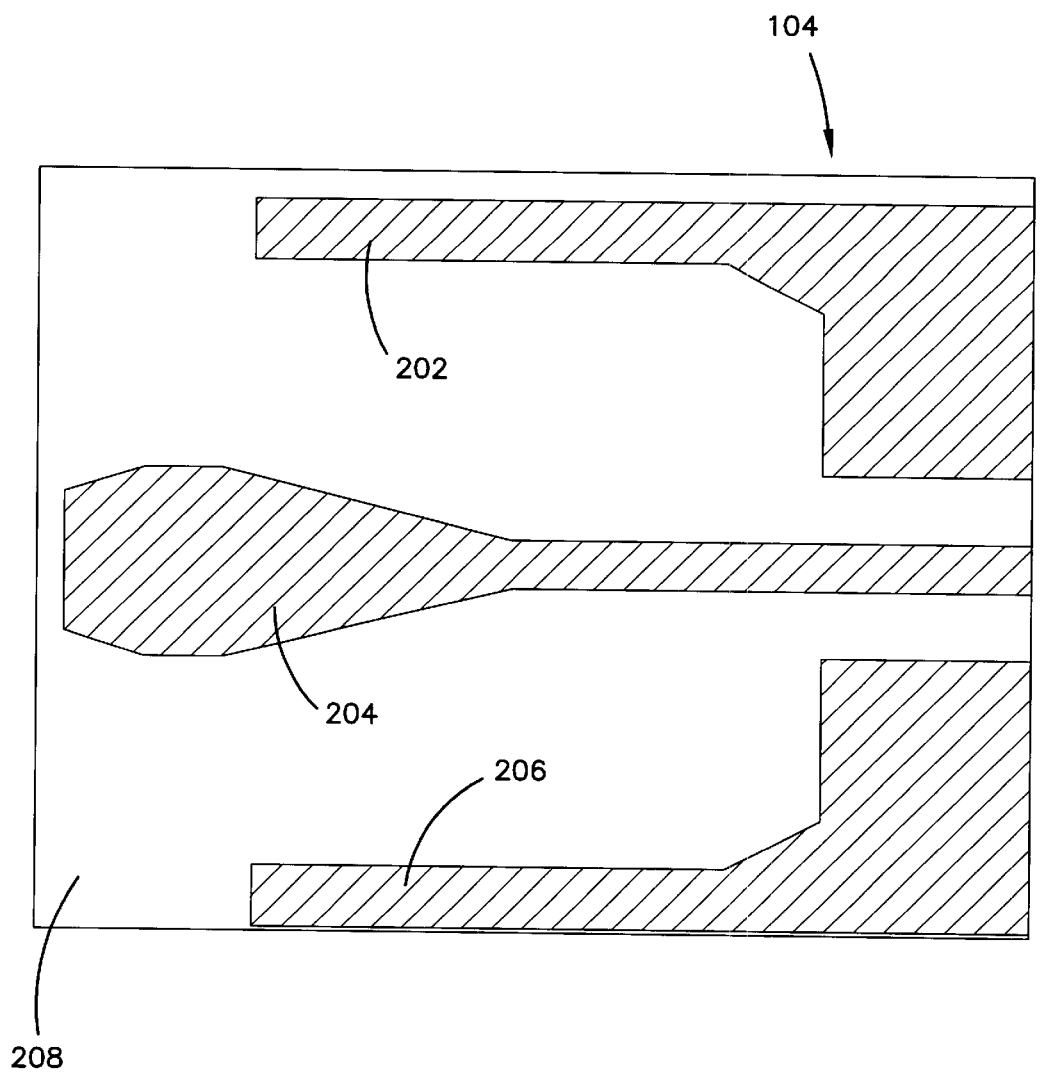
FIG. 2 represents the contact surface of a magnetic head used as an electrical probe in the apparatus of FIG. 1.

FIG. 2 illustrates the head surface of electronic probe 104. In a preferred embodiment, electronic probe 104 is a magnetic head such as that typically used in reading and writing information to a magnetic storage media such as a disc drive platter. Electronic probe 104 as illustrated includes portions 202, 204 and 206, which stand above etched portion 208. While the exact geometry of the head is unimportant, it is preferred that these surfaces be small enough to permit good disc/head contact for a given normal load or contact pressure. Preferably, a contact pressure or force is applied during testing to help ensure good contact between the disc surface and the head surface. Preferably, this force is about 3.5 grams or less.

Another aspect of the present invention that enhances head/disc contact is using a thin layer of lubricant 114, preferably a polymer layer, on the disc 108. This layer, preferably about 20 to 30 Å in depth, is in addition to the solid lubricant layers frequently applied to magnetic disc surfaces to protect them against wear. The polymeric lubricant is applied as a liquid, but preferably forms a soft solid once present as a thin layer on the disc surface. The thin layer of lubricant contributes very little to the overall resistivity measurement as it tends to breakdown at voltages well below those for carbon films.

A variety of lubricants can be used as lubricant layer 114. Preferably, the lubricant is a polymeric thin film having a low breakdown voltage. Preferably, this breakdown voltage is less than 0.1 volts for a film that is about 20 to 30 Å in depth. Examples of suitable lubricants include those available commercially under the FOMBLIN® tradename.

The electrical probe or magnetic head is loaded on to the disc surface through a spring or suspension (not shown) that holds the head in place. Since this suspension can be accurately calibrated and has relatively low stiffness, the force applied to the surface of the disc can therefore be accurately controlled. As described, this contact force contributes to achieving good head/disc contact.

Another important feature of the present invention involves either eliminating or controlling electrical breakdown of the thin carbon overcoat. This is accomplished in part by determining resistivity from the I-V performance plot, which effectively eliminates any measurement errors due to the breakdown of thin dielectric films such as a thin carbon overcoat. Using an electrometer to accurately control the applied voltage at low voltage ranges also contributes to the performance of the present invention.

In summary, a preferred embodiment of the invention is found in a method for determining the resistivity of a thin carbon overcoat having a known depth. The method includes the steps of providing a substrate including the thin carbon overcoat and providing an apparatus having a substrate holding device and an electronic probe. The electronic probe includes a magnetic head having two electrically distinct surfaces having a known total contact area. The method also includes the steps of placing a thin layer of lubricant over the thin carbon overcoat, bringing the electronic probe into close proximity to the substrate to be tested, and obtaining an I-V curve. The depth of the thin carbon overcoat and the contact area of the electronic probe are used to calculate the resistance and resistivity of the thin carbon overcoat.

Preferably, the step of obtaining an I-V curve includes a step of applying a voltage across the two electrically distinct surfaces of the electronic probe and measuring the resulting current. Variation in the resistance or resistivity of the thin carbon overcoat is preferably determined as a function of applied voltage. Alternatively, the resistance or resistivity of the thin carbon overcoat can also be determined at a specific applied voltage. Preferably, the breakdown voltage of the thin carbon overcoat is determined.

Preferably, the method for determining the resistivity of a thin carbon overcoat further includes a step of mounting the electronic probe on the substrate to be tested. The electronic probe is mounted in such a way as to accurately control a contact force between the electronic probe and the substrate to be tested.

In a preferred embodiment, the method for measuring the resistivity of a thin carbon overcoat on the electronic probe can be determined, the method further including using an electronic probe having a thin carbon overcoat, and providing a conductive substrate, wherein the conductive substrate has neither a magnetic surface nor a thin carbon overcoat.

A preferred embodiment of the invention is also found in an apparatus for measuring the resistivity of a thin carbon overcoat. The apparatus includes an electrically insulating holding structure suitable to hold a substrate having the thin carbon overcoat, an electronic probe including a magnetic head having two electrically distinct surfaces having a known total surface area, and an electrometer that can convert I-V curve data into resistance and resistivity values.

Preferably, the apparatus further includes a suspension mechanism that holds the electronic probe in close proximity to the thin carbon overcoat being tested. Preferably, the thin carbon overcoat has been applied to a substrate having a magnetic recording surface. Preferably, a thin layer of lubricant, preferably about 20 to 30 Å in depth is applied between the electronic probe and the substrate.

In a preferred embodiment, the thin carbon overcoat to be tested has been applied to the electronic probe; wherein the substrate has no magnetic material and no thin carbon overcoat present.

Preferably, the apparatus can determine resistance and resistivity variations as a function of applied voltage. Preferably, the apparatus can also determine resistance and resistivity at a specific applied voltage, as well as determining the breakdown voltage of the thin film being tested.

A preferred embodiment is found in an apparatus for measuring the resistivity of a thin carbon overcoat. The apparatus includes means to hold a substrate including a thin carbon overcoat without contacting the substrate in an electrically conducting manner, means to apply a voltage to the substrate and measure the resulting current, and means to determine the resistance and resistivity of the thin carbon overcoat.

Preferably, the means to hold a substrate includes an electrically insulating structure and the means to apply a voltage has an electronic probe. Preferably, the means to determine resistance and resistivity comprises an electrometer that can apply a voltage and measure a resulting current. More preferably, the means to determine resistance and resistivity also includes a thin layer of lubricant applied onto the substrate.

The following examples are intended to illustrate but not limit the scope of the claimed invention.

EXAMPLE 1

Figure 3:
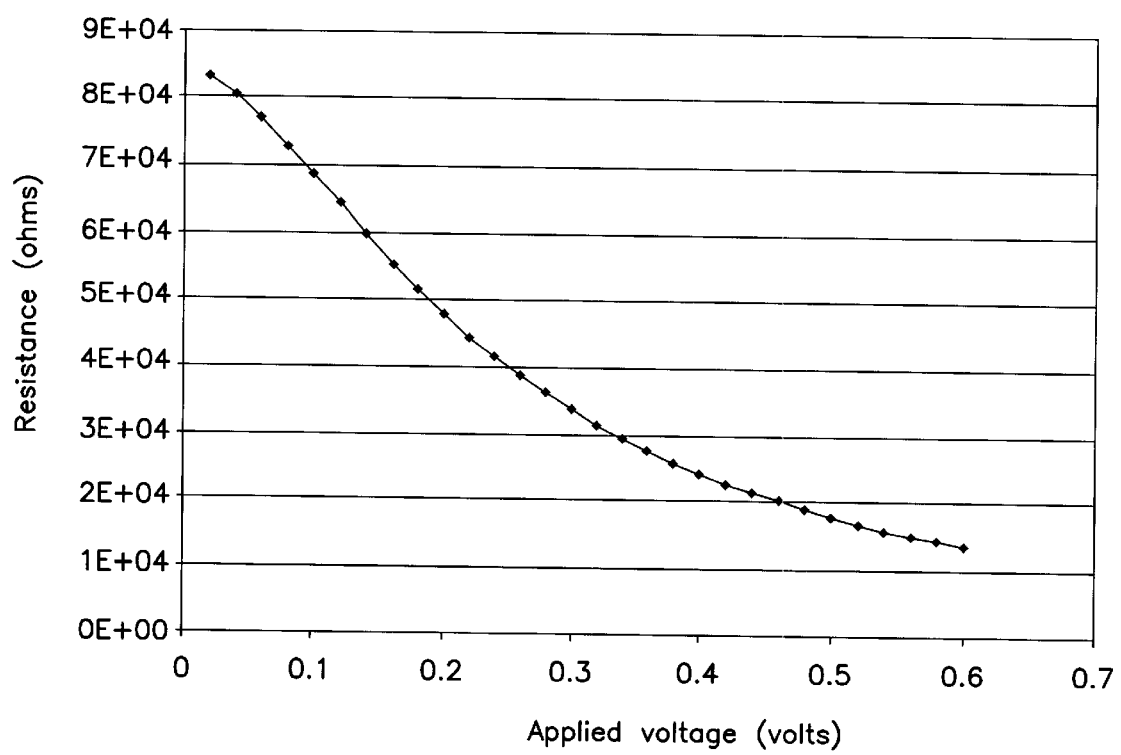
FIG. 3 is a plot of resistance versus applied voltage.

This example demonstrates use of the apparatus previously described. The structure tested was a magnetic disc having a thin carbon film of 150 Å applied to the disc with a lubricant layer of 20 Å applied over the thin carbon film. The resulting resistance versus applied voltage performance is seen in the graph of FIG. 3, which shows that the measured resistance decreases with applied voltage. Although not shown in the graph, it is known that break down occurs when the voltage reaches a critical value as indicated by a sudden current increase in the I-V plot.

Similar observation have been reported by others who have studied the electrical properties of carbon films on magnetic disc using a single probe technique. It was found that carbon resistivity decreases as a function of applied voltage due to thermal heating induced by high current/voltage. This has previously been confirmed by controlled heating and current experiments. This example indicates that the resistance of carbon films is not constant, but changes with applied current and voltage.

EXAMPLE 2

The testing described in Example 1 was repeated using discs having thin carbon overcoats having different compositions. Each thin carbon overcoat was applied to a depth of 145 Å and had an average surface roughness (Ra) of 15 Å. Each overcoat had an identical lubricant layer applied to it. This lubricant layer consisted of FOMBLIN AM3001® and an additive available commercially under the name XIP applied to a depth of 15 Å.

Figure 4A:
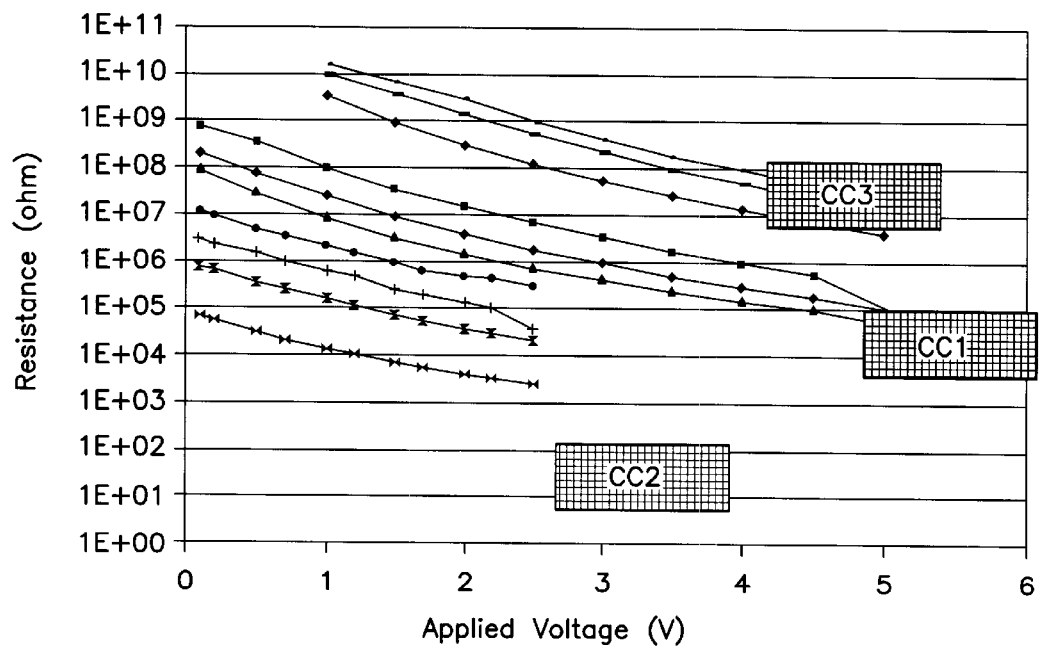
FIG. 4A is a plot of resistance versus applied voltage for carbon films having different H/N ratios.

FIG. 4A plots resistance versus applied voltage for each carbon overcoat. The carbon films tested are identified below in Table 1, wherein the balance of each composition is carbon. CC1 is essentially a hydrogen/nitrogen hybrid as each component is present in a similar amounts. CC2 is more heavily nitrogenated while CC3 is more heavily hydrogenated. Each composition was tested several times, resulting in duplicative data entries as seen in FIG. 4A.

TABLE 1

| Media | Carbon Composition |
| --- | --- |
| CC1 | 12% hydrogen, 8% nitrogen |
| CC2 | 7% hydrogen, 14% nitrogen |
| CC3 | 20% hydrogen, 2% nitrogen |

Figure 4B:
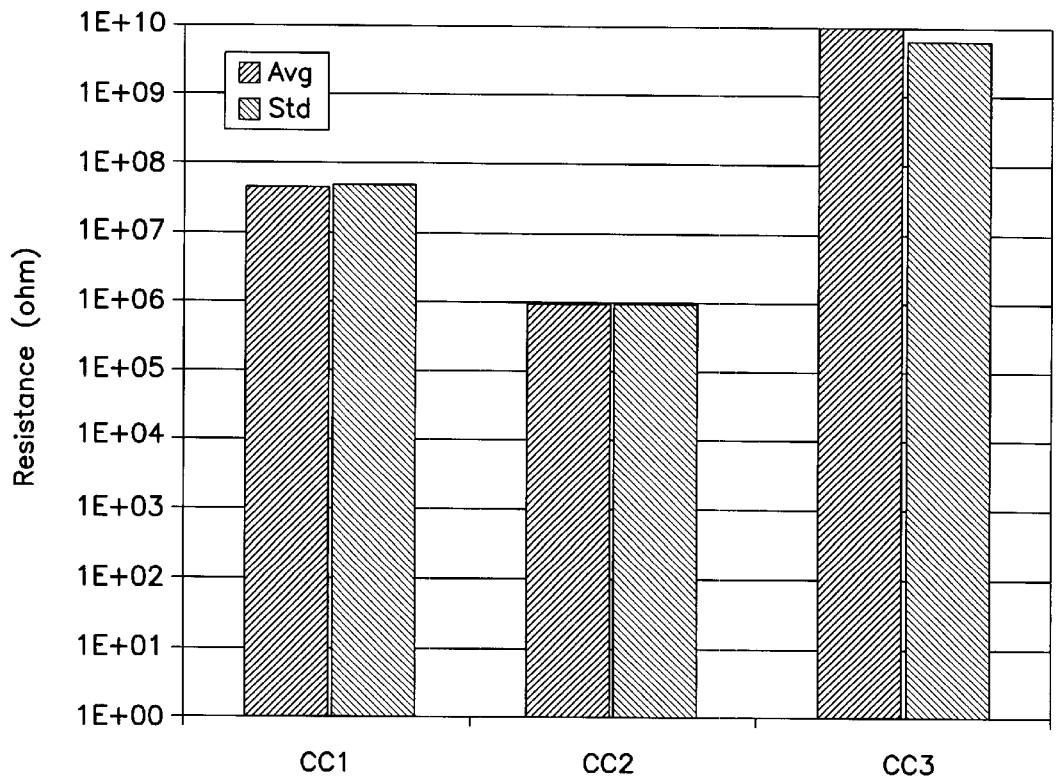
FIG. 4B is a statistical plot representing the data shown in FIG. 4A.

FIG. 4A shows that the three carbon films exhibit distinctly different resistance profiles with applied voltage. A following resistivity order can be seen: CC3>CC1>CC2. This is consistent with an expectation that adding hydrogen makes the carbon film more electrically resistant due to the removal of conductive $sp^2$ bonded carbon atoms. Conversely, incorporating nitrogen makes the carbon films more electrically conductive due to an increased level of $sp^2$ bonded carbon by nitrogen. FIG. 4B graphically compares resistance and standard deviation values for carbon films CC1, CC2 and CC3 at a voltage of about 1 volt.

EXAMPLE 3

Figure 5A:
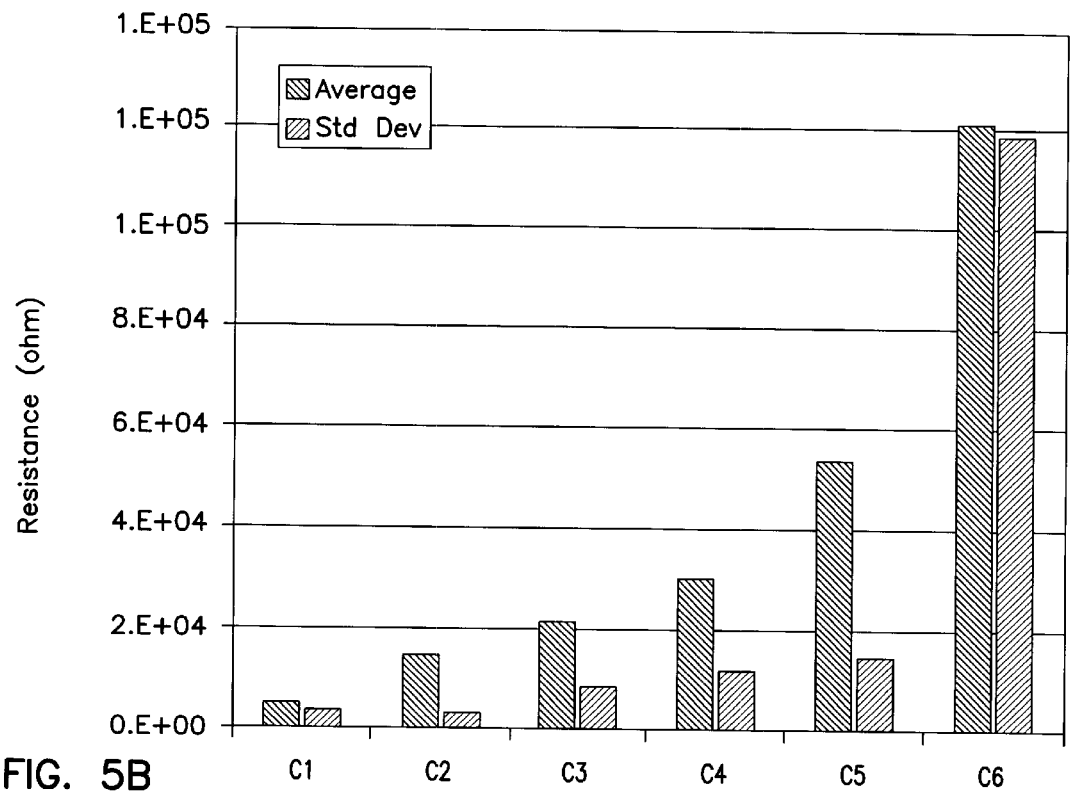
FIG. 5A is a statistical plot showing varying resistance in films of varying carbon thickness.

FIG. 5A shows the resistance measurements on magnetic discs having overcoats of varying thickness but identical in composition. In each case, the carbon composition included 8 percent hydrogen, 14 percent nitrogen and 78 percent carbon, and was applied with an average surface roughness of 7 Å. The specific lubricant used in each trial was FOMBLIN Z-dol-TX, applied to a thickness of 28 Å. The thickness of each carbon layer is given below in Table 2:

TABLE 2

| Media | Carbon Thickness |
| --- | --- |
| C1 | 58Å |
| C2 | 68Å |
| C3 | 86Å |
| C4 | 100Å |
| C5 | 115Å |
| C6 | 128Å |

Figure 5B:
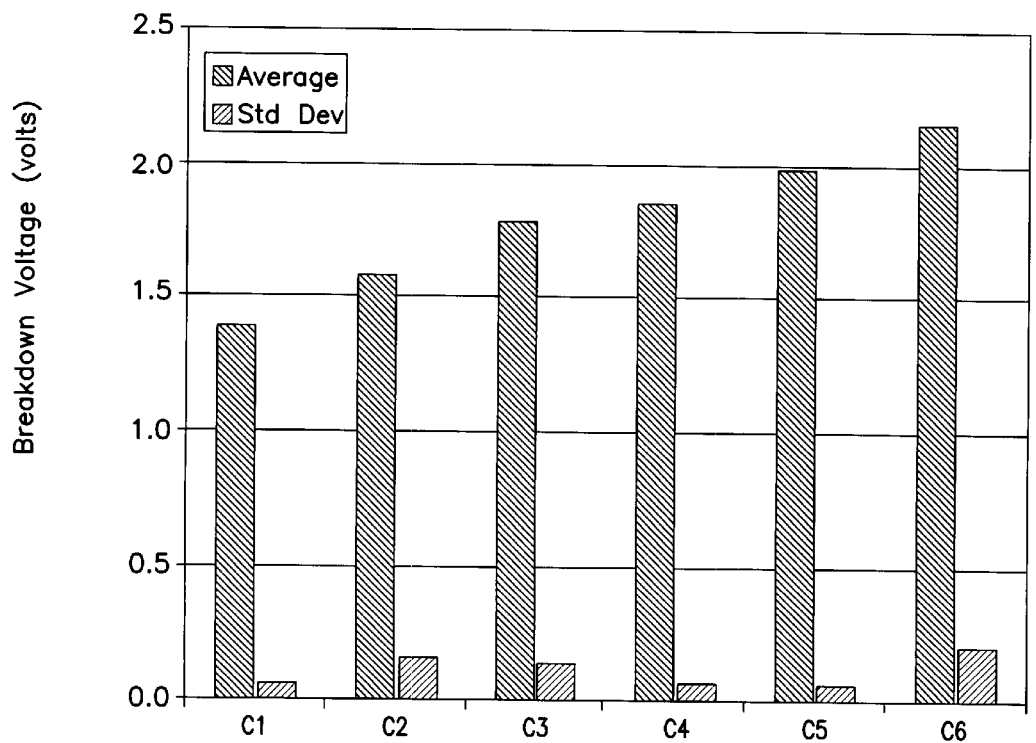
FIG. 5B is a statistical plot showing varying breakdown voltages in films of varying carbon thickness.

FIG. 5B illustrates breakdown voltages. FIGS. 5A and 5B show that both carbon film resistance and breakdown voltage increase with film thickness.

EXAMPLE 4

Figure 6:
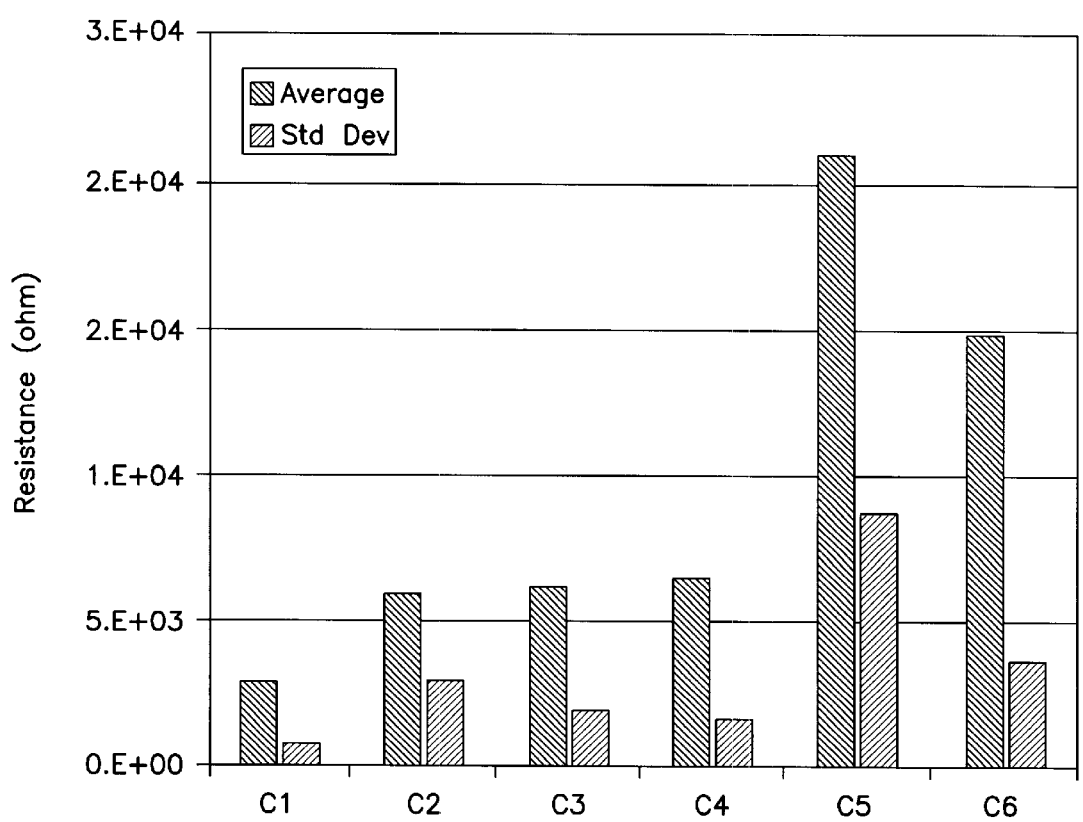
FIG. 6 is a statistical plot showing resistance measurements on disc samples with different carbon films but no lubrication layer.

This example illustrates the effects of not including a lubricant layer on the disc. In this example, resistivity measurements were conducted on discs having different carbon film thickness but no lubricant. These discs were from the same sputter run as those used in Example 3, and therefore had similar variations in carbon thickness. FIG. 6 shows the resistance measurements. Compared with FIG. 5A, the trend of increasing resistance with carbon thickness is still seen, but the change becomes less smooth, and the data for media C6 is out of trend. This could be attributed to poor contact between the head and disc surface as poor contact can cause low and uncontrolled current flow. This example indicates that a lubricant layer can improve head/disc contact and therefore can improve resistivity calculations.

EXAMPLE 5

Figure 7A:
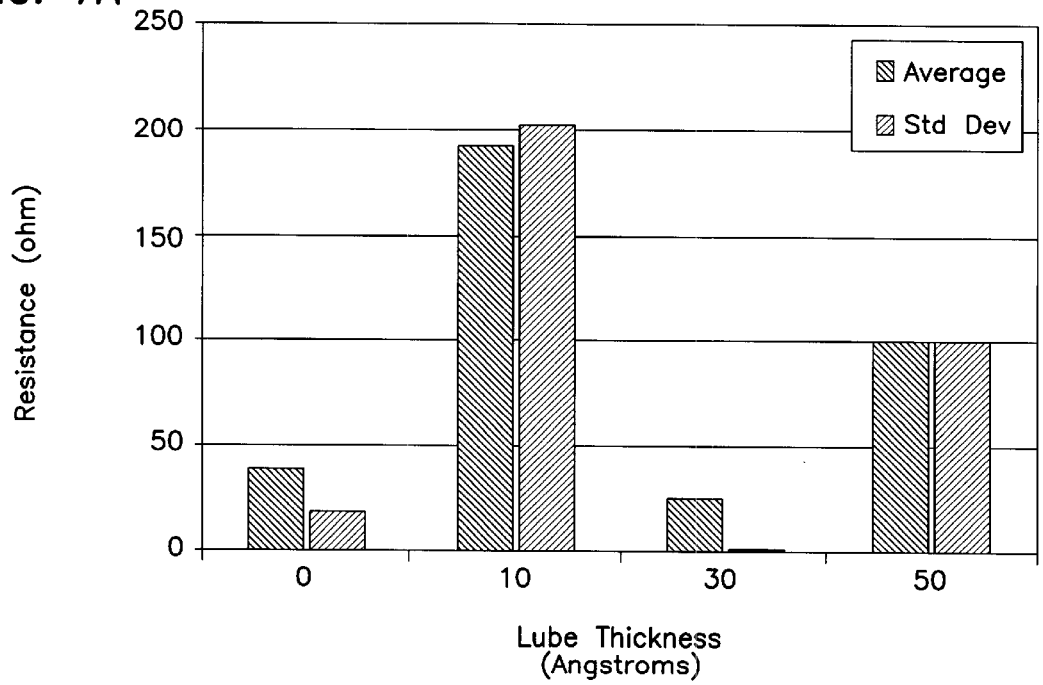
FIG. 7A is a statistical plot showing the variation in resistance measurements for lubricant layers of varying depth.
Figure 7B:
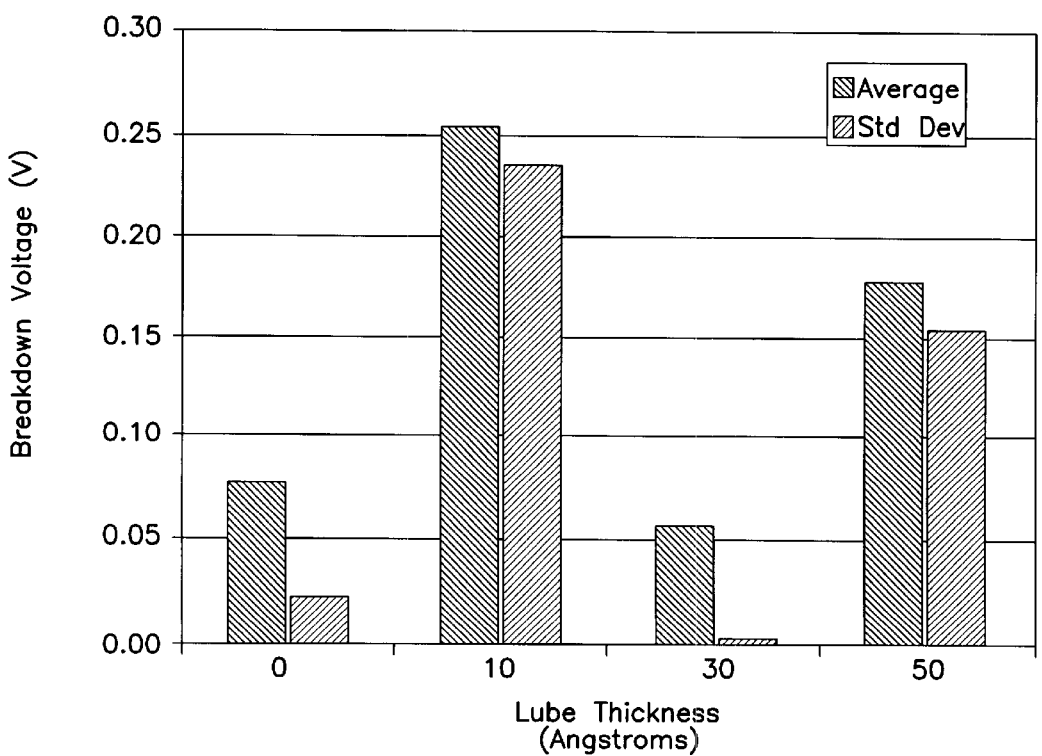
FIG. 7B is a statistical plot showing the variation in breakdown voltages for lubricant layers of varying depth.

In this example, the resistivity of thin lubricant layers was measured by coating a disc substrate lacking a carbon film with lubricant to form lubricant layers of different thickness. The results are shown in FIGS. 7A and 7B. FIG. 7A shows resistance data while FIG. 7B illustrates breakdown voltages. It was found that the resistance of the lubricant layer is very small (less than 200 ohm) in the voltage range from 1 to 10 volts, which is typically the operating range which a disc would be exposed to. The variation of resistance with lubricant thickness does not show a clear trend. However, it appears that a lubricant layer 30 Å thick gives the lowest resistance and measurement variation.

EXAMPLE 6

Figure 10:
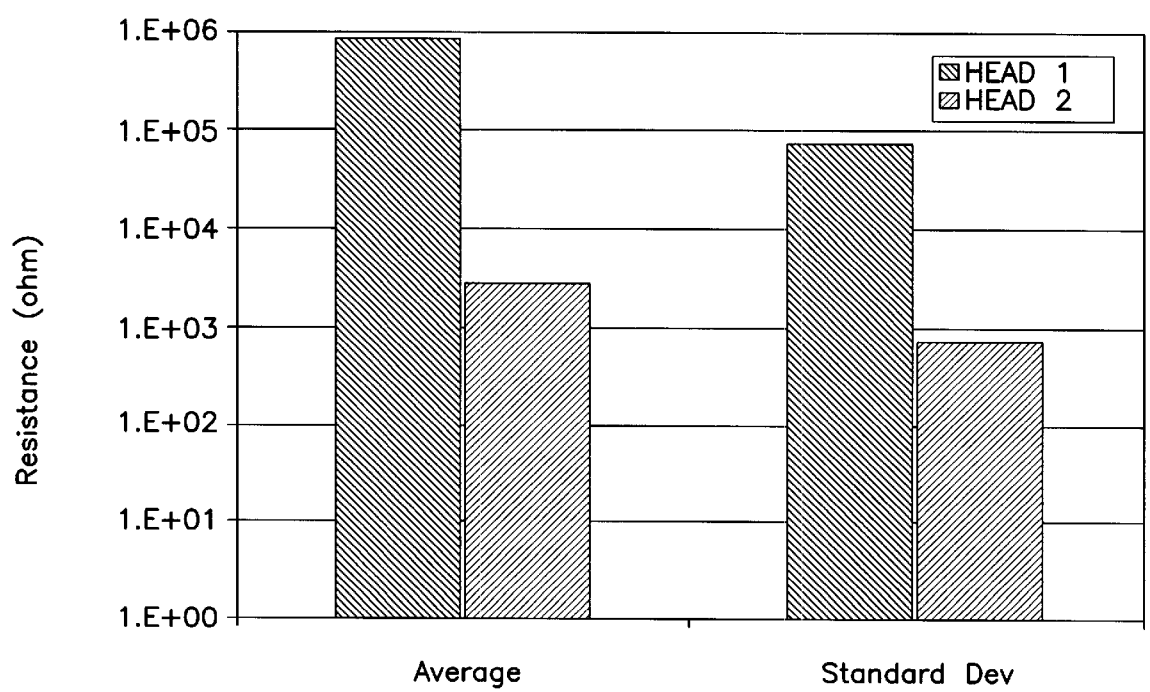
FIG. 10 is a statistical plot showing resistance measurements made on carbon films present on several different magnetic heads.

The technique according to the present invention can also be applied to measure the resistance of a carbon overcoat on a magnetic head. This can be done using a conductive disc, e.g. a substrate disc with no carbon or magnetic layer. FIG. 10 shows measurements made on two different carbon overcoats present on magnetic heads. Composition analysis indicates that the high resistance carbon film (labeled here as HEAD #1) has high thickness and high hydrogen content. This is consistent with other measurements that adding hydrogen makes carbon film more electrically insulating.

COMPARATIVE EXAMPLE

Figure 8A:
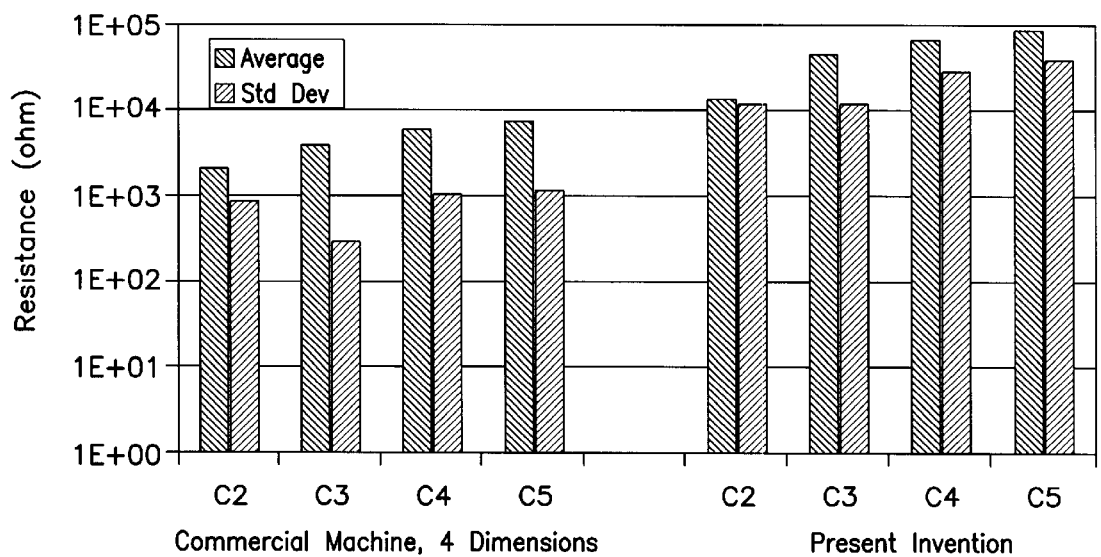
FIG. 8A is a statistical plot of resistance versus carbon depth comparing the present invention to a commercially available machine.
Figure 8B:
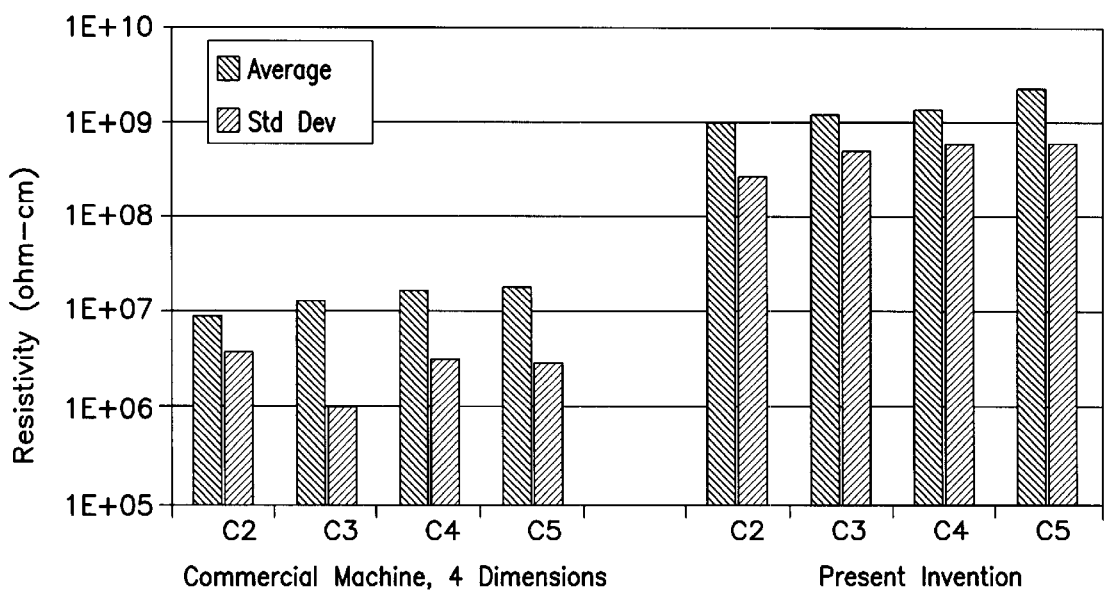
FIG. 8B is a statistical plot of resistivity versus carbon depth comparing the present invention to a commercially available machine.

A commercial machine (CV Map 92A, 4 Dimensions, Inc.) used for measuring resistivity of thin semiconductor films was used for comparison with the method of testing according to the present invention. The commercial machine uses a mercury probe to achieve good electrical contact with the thin films to be measured. It also uses the I-V curve to determine the resistivity of thin films. During comparative testing, the carbon film samples used in FIG. 5 were measured with the commercial machine. Measurements were done on two surfaces and 4 locations (2 locations per disc surface and 2 surfaces per disc type) and the results are shown in FIGS. 8A and 8B. FIG. 8A shows the resistance measured at 0.2 V from the I-V curve while FIG. 8B shows the resistivity calculated from resistance, carbon thickness and contact area. The carbon overcoats tested were shown above in Table 2.

Three things can be seen from these comparisons. Both techniques show similar trends in that resistance increases with carbon thickness. The resistivity values measured with the commercial machine are lower than those measured by the technique of the present invention. Both techniques show relatively high measurement error (standard deviation/average value), but the commercial machine shows lower measures error than the present technique (18.6% vs 46.2%). However, these measurement errors are still within acceptable limits. Higher resistivity with the present technique is believed to be caused by how the contact area is determined. Currently, the apparent contact area, i.e., air bearing surface area, is used in the calculation. The true contact area is smaller due to head sitting attitude and presence of particular materials on disc surface. Assuming the resistivity measured with the commercial machine is calculated using the true contact area, then the true contact area measured with present technique can be estimated as being about 20% of the apparent area.

Figure 9:
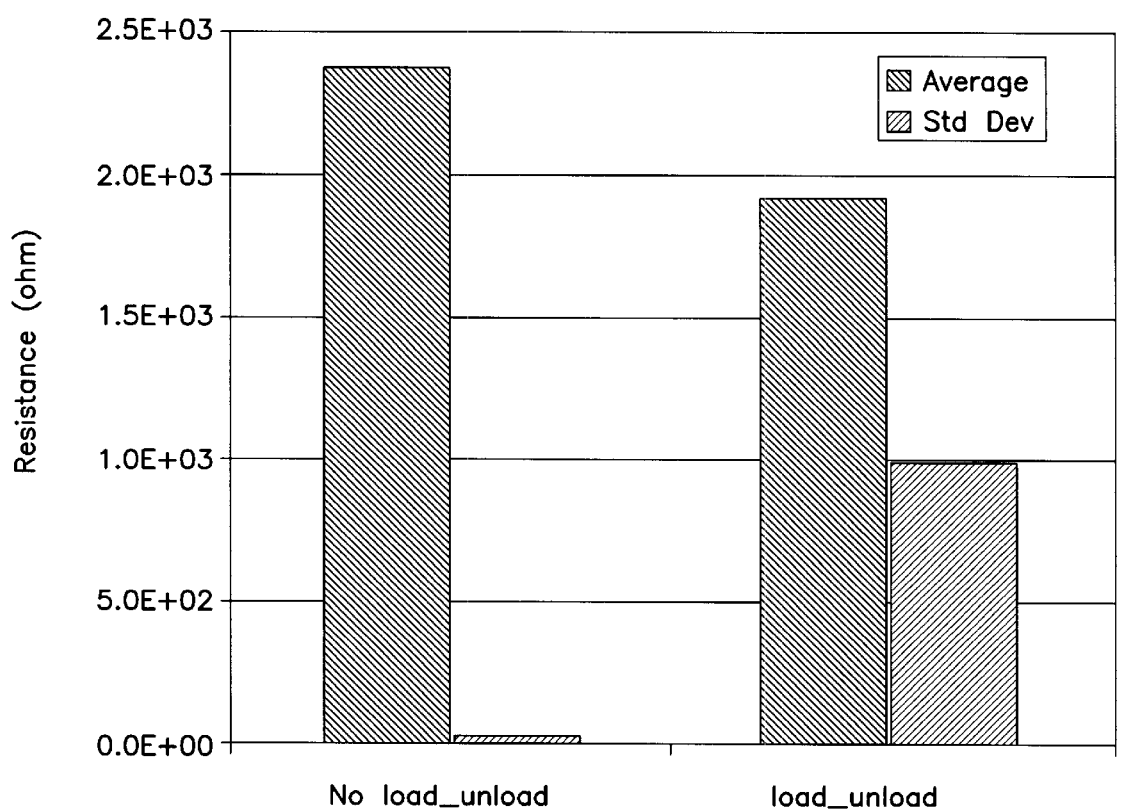
FIG. 9 is a graphical representation of measurement errors.

The measurement errors have been evaluated in two tests. In the first test, resistance measurements were repeated many times at one disc location without loading and reloading the head. This test shows the repeatability of the measurement circuit. The results are shown in FIG. 9 (left histogram). The sigma/average ratio is 0.8%, (ratio between standard deviation and average value) indicating a very good repeatability, as does the small standard deviation. In the second test, measurements were done many times at one location with load-unload for each measurement. The results are also given in FIG. 9 (right histogram). The sigma/average ratio is 51%. This test also shows a substantially greater standard deviation. It is clear that the load-unload process is the major contributor of measurement uncertainty. It is believed that contact area variation in the load-unload process is the major reason. Nevertheless, this measurement error is still much smaller than the technique with two probes where measurement errors up to $10^3$ are usually seen. This level of error is also comparable to the uncertainty level of a commercial machine.

It will be clear that the present invention is well adapted to attain the ends and advantages mentioned as well as those inherent therein. While a presently preferred embodiment has been described for purposes of this disclosure, numerous changes may be made which will readily suggest themselves to those skilled in the art and which are encompassed in the spirit of the invention disclosed and as defined in the appended claims.

What is claimed is:

1. A method for determining the resistivity of a thin carbon overcoat, the thin carbon overcoat having a known depth, the method comprising steps of:

mounting a substrate having a thin carbon overcoat on a substrate holding device;

applying a thin layer of lubricant on the thin carbon overcoat;

bringing an electronic probe into close proximity to the substrate, wherein the electronic probe includes a magnetic head having two electrically distinct surfaces having a known total contact area and the magnetic head provides large contact area without causing mechanical penetration of the thin carbon overcoat;

obtaining an I-V curve; and calculating the resistance and the resistivity of the thin carbon overcoat using the I-V curve, the known depth of the thin carbon overcoat and the known contact area of the electronic probe.

2. The method of claim 1 further comprising a step of mounting the electronic probe on the substrate to be tested;

wherein the electronic probe is mounted in such a way as to accurately control a contact force between the electronic probe and the substrate to be tested.

3. The method of claim 1 wherein the step of obtaining an I-V curve comprises a step of applying a voltage across the two electrically distinct surfaces of the electronic probe and measuring the resulting current.

4. The method of claim 1 wherein the resistivity of a thin carbon overcoat on the electronic probe can be determined, the method comprising further steps of:

using an electronic probe having a thin carbon overcoat; and providing a conductive substrate, wherein the conductive substrate has neither a magnetic surface nor a thin carbon overcoat.

5. The method of claim 1 further comprising the step of calculating the resistance of the thin carbon overcoat as a function of applied voltage.

6. The method of claim 1 further comprising the step of calculating the resistance of the thin carbon overcoat at a specific applied voltage.

7. The method of claim 1 further comprising the step of determining a breakdown voltage of the thin carbon overcoat.

8. An apparatus for measuring the resistivity of a thin carbon overcoat, the apparatus comprising:

an electrically insulating holding structure suitable to hold a substrate comprising the thin carbon overcoat;

an electronic probe having a magnetic head with two electrically distinct surfaces having a known total surface area; and an electrometer that can calculate I-V data.

9. The apparatus of claim 8 further comprising a suspension mechanism that holds the electronic probe in close proximity to the thin carbon overcoat being tested.

10. The apparatus of claim 8 wherein the thin carbon overcoat to be tested has been applied to a substrate comprising a magnetic recording surface.

11. The apparatus of claim 8 wherein the thin carbon overcoat to be tested has been applied to the electronic probe; wherein the substrate has no magnetic material and no thin carbon overcoat present.

12. The apparatus of claim 8 further comprising a thin layer of lubricant between the electronic probe and the substrate being tested.

13. The apparatus of claim 12 wherein the thin layer of lubricant is about 20 to 30 Angstroms in depth.

14. The apparatus of claim 8 wherein the apparatus can determine resistance and resistivity variations as a function of applied voltage.

15. The apparatus of claim 8 wherein the apparatus can determine resistance and resistivity at a specific applied voltage.

16. The apparatus of claim 8 wherein the apparatus can determine the breakdown voltage of the thin carbon overcoat.

17. An apparatus for measuring the resistivity of a thin carbon overcoat, the apparatus comprising:

means to hold a substrate comprising the thin carbon overcoat without contacting the substrate in an electrically conducting manner;

means to apply a voltage to the substrate and measure the resulting current; and means to determine the resistance and resistivity of the thin carbon overcoat.

18. The apparatus of claim 17 wherein the means to hold a substrate comprises an electrically insulating structure.

19. The apparatus of claim 17 wherein the means to apply a voltage comprises an electronic probe.

20. The apparatus of claim 17 wherein the means to determine resistance and resistivity comprises an electrometer that can apply a voltage and measure a resulting current.

21. The apparatus of claim 20 wherein the means to determine resistance and resistivity further comprises a thin layer of lubricant applied onto the substrate.

* * * * *

UNITED STATES PATENT AND TRADEMARK OFFICE
CERTIFICATE OF CORRECTION

PATENT NO. : 6,313,647 B1
DATED : November 6, 2001
INVENTOR(S) : Feng et al.

It is certified that error appears in the above-identified patent and that said Letters Patent is hereby corrected as shown below:

<u>Title page,</u>
Item [57],
ABSTRACT,
First line, "anew" should read -- a new --.

Signed and Sealed this

Eighteenth Day of June, 2002

*Attest:*

JAMES E. ROGAN
*Attesting Officer*    *Director of the United States Patent and Trademark Office*